United States Patent
Choi et al.

(10) Patent No.: US 9,024,649 B2
(45) Date of Patent: May 5, 2015

(54) INSERT FOR SEMICONDUCTOR PACKAGE AND TESTING APPARATUS WITH THE SAME

(75) Inventors: Guiheum Choi, Chungcheongnam-do (KR); Minsu Kang, Asan-si (KR); Teaseog Um, Asan-si (KR); Seunghee Lee, Cheonam-si (KR)

(73) Assignee: Samsung Electronics Co., Ltd. (KR)

( * ) Notice: Subject to any disclaimer, the term of this patent is extended or adjusted under 35 U.S.C. 154(b) by 355 days.

(21) Appl. No.: 13/587,407

(22) Filed: Aug. 16, 2012

(65) Prior Publication Data
US 2013/0127484 A1    May 23, 2013

(30) Foreign Application Priority Data
Nov. 21, 2011  (KR) .................. 10-2011-0121714

(51) Int. Cl.
  *G01R 31/00*    (2006.01)
  *G01R 31/28*    (2006.01)
  *G01R 1/04*     (2006.01)
(52) U.S. Cl.
  CPC .......... *G01R 31/2886* (2013.01); *G01R 1/0466* (2013.01); *G01R 31/2893* (2013.01)

(58) Field of Classification Search
  USPC ............ 324/750.01–750.19, 754.04, 754.11, 324/756.02–756.05
  See application file for complete search history.

(56) References Cited

U.S. PATENT DOCUMENTS

| 7,151,368 B2 | 12/2006 | Joung et al. |
| 7,408,175 B2 * | 8/2008 | Kimba et al. ............ 250/441.11 |
| 8,626,096 B2 * | 1/2014 | Park et al. ..................... 455/137 |

FOREIGN PATENT DOCUMENTS

| KR | 1020060109583 | 10/2006 |
| KR | 1020080086702 | 9/2008 |

* cited by examiner

*Primary Examiner* — Melissa Koval
*Assistant Examiner* — Trung Nguyen
(74) *Attorney, Agent, or Firm* — Onello & Mello, LLP

(57) ABSTRACT

An insert for a semiconductor package testing apparatus comprises a body having a pocket constructed and arranged to receive the semiconductor package, and a sliding tool slidingly positioned on the body. The sliding tool is constructed and arranged to open and close the pocket as a result of a sliding motion of the sliding tool relative to the body.

20 Claims, 16 Drawing Sheets

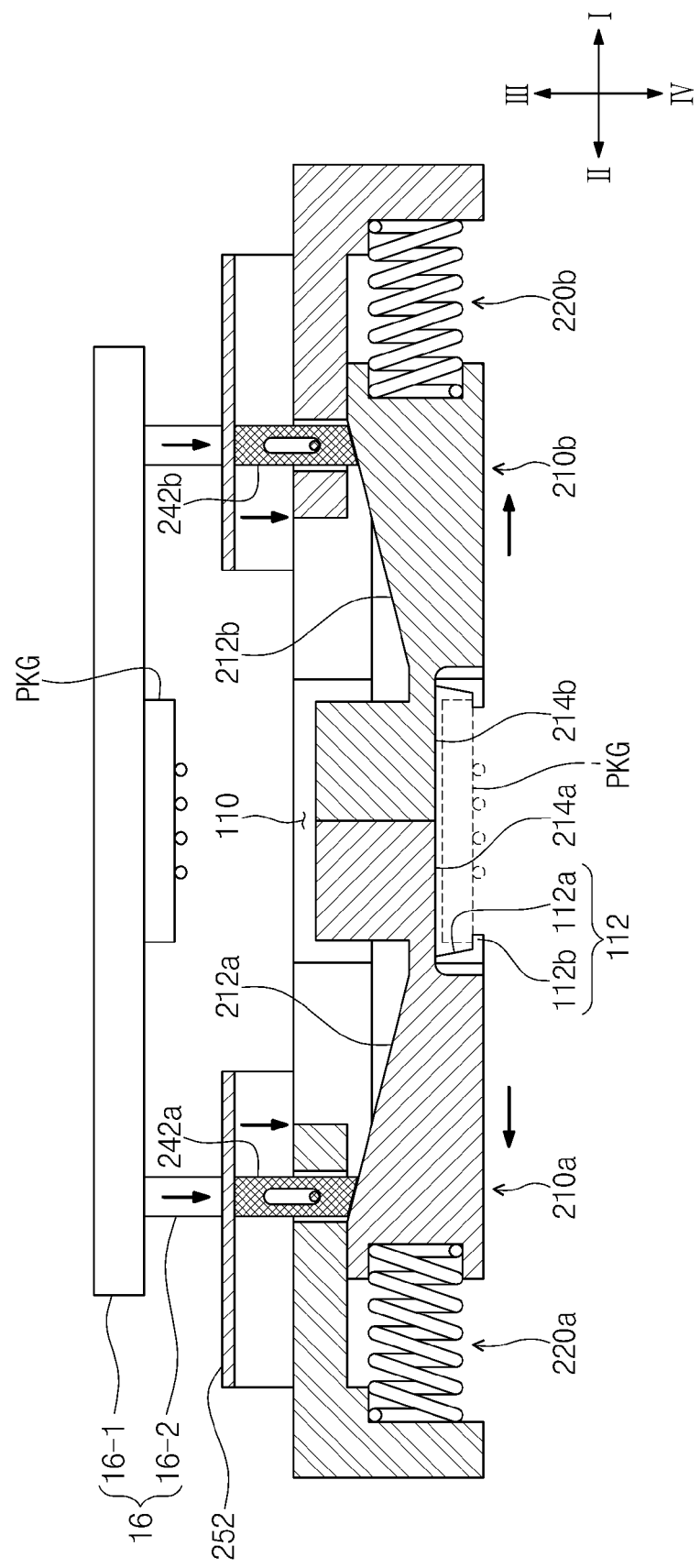

INSERT FOR SEMICONDUCTOR PACKAGE AND TESTING APPARATUS WITH THE SAME

CROSS-REFERENCE TO RELATED APPLICATIONS

This U.S. non-provisional patent application claims priority under 35 U.S.C. §119 to Korean Patent Application No. 10-2011-0121714, filed on Nov. 21, 2011, the entirety of which is incorporated by reference herein.

BACKGROUND

Inventive concepts relate to an insert for a semiconductor package and a testing apparatus including the same and, more particularly, to an insert provided in a testing tray for receiving a semiconductor package and a testing apparatus including the same.

Semiconductor chips are commonly encapsulated to ensure protection from external environmental factors. The encapsulation is shaped into a semiconductor package shape in a packaging process. Following the performance of certain reliability tests such as an electrical characteristic test or a burn-in test, assuming the tests are a success, the resulting semiconductor packages are designated for customers. During manufacture and test, the semiconductor packages are commonly transferred on a test tray. An insert constructed and arranged for receiving the semiconductor package may be provided in the test tray.

SUMMARY

Embodiments of the inventive concepts may provide inserts capable of decreasing a yield loss of a semiconductor package testing process and improving productivity. Embodiments of the inventive concepts may further provide a testing apparatus with the same.

An insert for a semiconductor package testing apparatus, comprises: a body having a pocket constructed and arranged to receive the semiconductor package; and a sliding tool slidingly positioned on the body, the sliding tool constructed and arranged to open and close the pocket as a result of a sliding motion of the sliding tool relative to the body.

In some embodiments, the sliding tool comprises: first and second sliders at opposite portions of the pocket; a first biasing unit that is biased to urge the first slider in a first direction toward the second slider; and a second biasing unit that is biased to urge the second slider in a second direction toward the first slider.

In some embodiments, the sliding tool further comprises: a pressure member constructed and arranged to push the first slider in the second direction and to push the second slider in the first direction as a result of an applied vertical pressure.

In some embodiments, the first slider comprises a first sloped surface inclined in a downward direction with respect to the first direction at a top surface of the first slider, and the second slider comprises a second sloped surface inclined in a downward direction with respect to the second direction at a top surface of the second slider; and wherein the pressure member comprises: a first pressure load in communication with the body, the first pressure load constructed and arranged to move in a vertical direction relative to a horizontal direction of extension of the body, the first pressure load communicating with the first sloped surface of the first slider; and a second pressure load in communication with the body, the second pressure load constructed and arranged move in the vertical direction, and the second pressure load communicating with the second sloped surface of the second slider.

In some embodiments, the further comprises stopper holes in the first and second pressure loads that mate with limiters on the body to restrict travel in the vertical direction of the first and second pressure loads relative to the body.

In some embodiments, a bottom surface of the first pressure load is inclined with the same gradient as the first sloped surface, and wherein a bottom surface of the second pressure load is inclined with the same gradient as the second sloped surface.

In some embodiments, the bottom surfaces of the first and second pressure loads have curved lower surfaces.

In some embodiments, the pressure member further comprises a pressing plate coupled to top ends of the first and second pressure loads; wherein the pressing plate comprises: a top plate extending in the first and second horizontal directions, wherein the top ends of the first and second pressure loads are coupled to the top plate, wherein the top plate further comprises an opening corresponding to the pocket; side plates extending in the downward direction from sides of the top plate; and guide protrusions extending from inner surfaces of the side plates, wherein the body includes guide grooves constructed and arranged to communicate with the guide protrusions.

In some embodiments, the first and second elastic bodies comprise springs.

In some embodiments, a first step-difference part comprises a first bottom surface of the first slider, and wherein the first step-difference part covers a first sidewall facing in the second direction of sidewalls of the semiconductor package and a portion of a top surface of the semiconductor package; wherein a second step-difference part comprises a second bottom surface of the second slider, and wherein the second step-difference part covers a second sidewall facing in the first direction of sidewalls of the semiconductor package and another portion of the top surface of the semiconductor package; and wherein horizontal surfaces of the first and second step-difference parts are spaced apart from the top surface of the semiconductor package by a predetermined distance.

In some embodiments, the insert further comprises: a printed circuit board positioned under the pocket and supporting the semiconductor package; and an elastic body connecting the printed circuit board to a bottom of the pocket, wherein first connection terminals are provided on a top surface of the printed circuit board and are constructed and arranged to be in contact with external terminals of the semiconductor package; and wherein second connection terminals are provided on a bottom surface of the printed circuit board and are electrically connected to the first connection terminals.

In another aspect, a testing apparatus comprises: an insert constructed and arranged to receive a semiconductor package; a socket that applies a test signal to the semiconductor package; and a pusher that applies a contact pressure to the insert to bring the semiconductor package into contact with the socket, wherein the insert comprises: a body having a pocket constructed and arranged to receive the semiconductor package; and a sliding tool slidingly positioned on the body, the sliding tool constructed and arranged to open and close the pocket as a result of a sliding motion of the sliding tool relative to the body In some embodiments, the sliding tool comprises: first and second sliders at opposite portions of the pocket; a first biasing unit that is biased to urge the first slider in a first direction toward the second slider; and a second biasing unit that is biased to urge the second slider in a second direction toward the first slider; wherein the pusher applies the contact pressure to pressure the first and second sliders to bring the semiconductor package into contact with the socket in a state in which the pocket is closed.

In some embodiments, the first slider comprises a first sloped surface inclined in a downward direction with respect to the first direction at a top surface of the first slider, and the second slider comprises a second sloped surface inclined in a downward direction with respect to the second direction at a top surface of the second slider, and wherein the sliding tool comprises: first pressure load in communication with the body, the first pressure load constructed and arranged to move in a vertical direction relative to a horizontal direction of extension of the body, the first pressure load communicating with the first sloped surface of the first slider; and a second pressure load in communication with the body, the second pressure load constructed and arranged move in the vertical direction, and the second pressure load communicating with the second sloped surface of the second slider; and a pressing plate coupled to top ends of the first and second pressure loads, wherein the top plate further comprises an opening corresponding to a region above the pocket.

In some embodiments, the testing apparatus further comprises: a transfer member constructed and arranged to transfer the semiconductor package received in a tray to the insert, wherein the transfer member comprises: a picker that picks up the semiconductor package; and a pressing pin combined with the picker, wherein the pressing pin pressures the pressing plate, thereby opening the pocket; and wherein the picker introduces the semiconductor package into the pocket through the opening.

In another aspect, an insert for a semiconductor testing apparatus comprises: a body having a pocket constructed and arranged to receive a semiconductor package to be tested, the semiconductor package having a height and having a lower surface and an upper surface; a sliding tool slidingly attached to the body for opening and closing the pocket and constructed and arranged to support the semiconductor package at the lower surface of the semiconductor package; the pocket, when in a closed position, having a ceiling and the ceiling having a first clearance distance above the upper surface of the semiconductor package when supported in the sliding tool, the first clearance distance being determined based on the height of the semiconductor package to be tested.

In some embodiments, the insert further comprises a force transfer portion of the sliding tool above the ceiling has, the force transfer portion having a thickness above the ceiling and wherein the thickness is determined based on the height of the semiconductor package to be tested.

In some embodiments, the insert comprises multiple inserts, each of the multiple inserts corresponding to a different semiconductor package to be tested, and wherein the thickness of the force transfer portion above the ceiling of each of the multiple insert varies in accordance with the height of the corresponding semiconductor package to be tested.

In some embodiments, the sliding tool is constructed and arranged to open and close the pocket as a result of a sliding motion of the sliding tool relative to the body.

In some embodiments, the sliding tool comprises: first and second sliders at opposite portions of the pocket; a first biasing unit that is biased to urge the first slider in a first direction toward the second slider; a second biasing unit that is biased to urge the second slider in a second direction toward the first slider; and a pressure member constructed and arranged to push the first slider in the second direction and to push the second slider in the first direction as a result of an applied vertical pressure.

BRIEF DESCRIPTION OF THE DRAWINGS

The inventive concepts will become more apparent in view of the attached drawings and accompanying detailed description.

FIG. 6 is a cross-sectional view illustrating a method of receiving a semiconductor package into an insert of the type illustrated in FIG. 3;

DETAILED DESCRIPTION OF EMBODIMENTS

Figure 1:
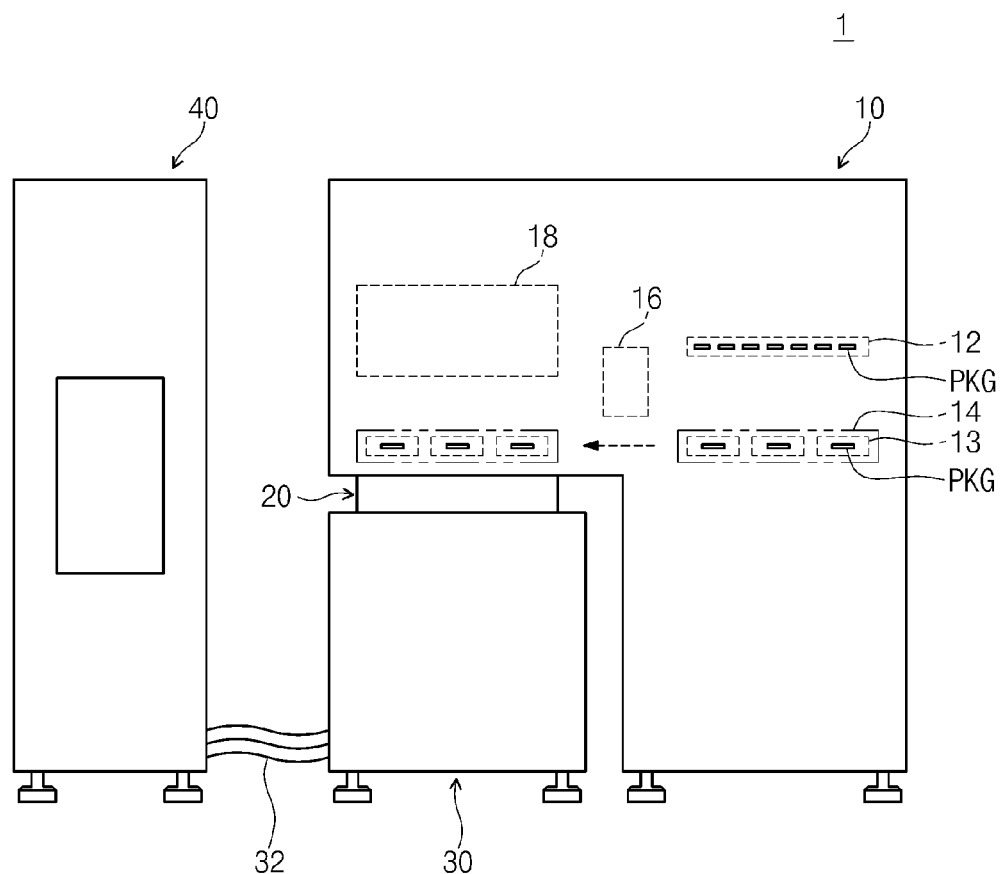
FIG. 1 is a schematic view illustrating a semiconductor package testing apparatus according to an embodiment of the inventive concepts.

The inventive concepts will now be described more fully hereinafter with reference to the accompanying drawings, in which exemplary embodiments of the inventive concept are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concept. In the drawings, embodiments of the inventive concepts are not limited to the specific examples provided herein and are exaggerated for clarity.

The terminology used herein is for the purpose of describing particular embodiments only and is not intended to limit. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, embodiments of the inventive concepts will be described with reference to the drawings.

FIG. 1 is a schematic view illustrating a semiconductor package testing apparatus 1 according to an embodiment of the inventive concept. Referring to FIG. 1, the semiconductor package testing apparatus 1 includes a handler 10, a socket part 20, a test head 30, and a controller 40.

The handler 10 is configured to load/unload semiconductor packages PKG into/from the socket part 20. Additionally, the handler 10 may classify the tested semiconductor packages PGK according to the test results. The semiconductor packages PKG may be transferred within the handler 10 by a tray 12, 14 during processing by the handler. The semiconductor packages PKG may be provided into the handler 10 in the state whereby the semiconductor packages PKG are received in a first tray 12. A second tray 14 having inserts 13 may also be provided in the handler 10. In some embodiments, the inserts 13 may be disposed in the second tray 14 in a regular arrangement. The semiconductor packages PKG present in the first tray 12 may be transferred into the inserts 13 of the second tray 14 by a transfer member or unit 16. The second tray 14 may be transferred into communication with the socket part 20 by a transfer robot (not shown) or other suitable transfer mechanism. In this manner, the semiconductor packages PKG may be transferred into the socket part 20 in a state whereby the semiconductor packages PKG are positioned in or on the inserts 13. The semiconductor packages PKG may be made to be in contact with sockets (not shown) of the socket part 20 as a result of the physical pressure imparted by a pusher 18. In industry, the first tray 12 can often times be referred to as a "customer tray", and the second tray 14 can often times be referred to as a "test tray".

An upper portion of the socket part 20 including sockets (not shown) may be inserted in, or otherwise oriented or directed toward, the handler 10, and a lower portion of the socket part 20 may be disposed on the test head 30. The test head 30 may be electrically connected to the controller 40 by a cable 32. In some embodiments, the controller 40 may apply a test signal to the semiconductor packages PKG through the cable 32, the test head 30, and the socket part 20. Reply signals read from the semiconductor packages PKG may be transmitted to the controller 40 through the socket part 20, the test head 30, and the cable 32. The controller 40 may analyze the reply signals to determine whether the semiconductor packages PKG are electrically reliable.

Figure 2:
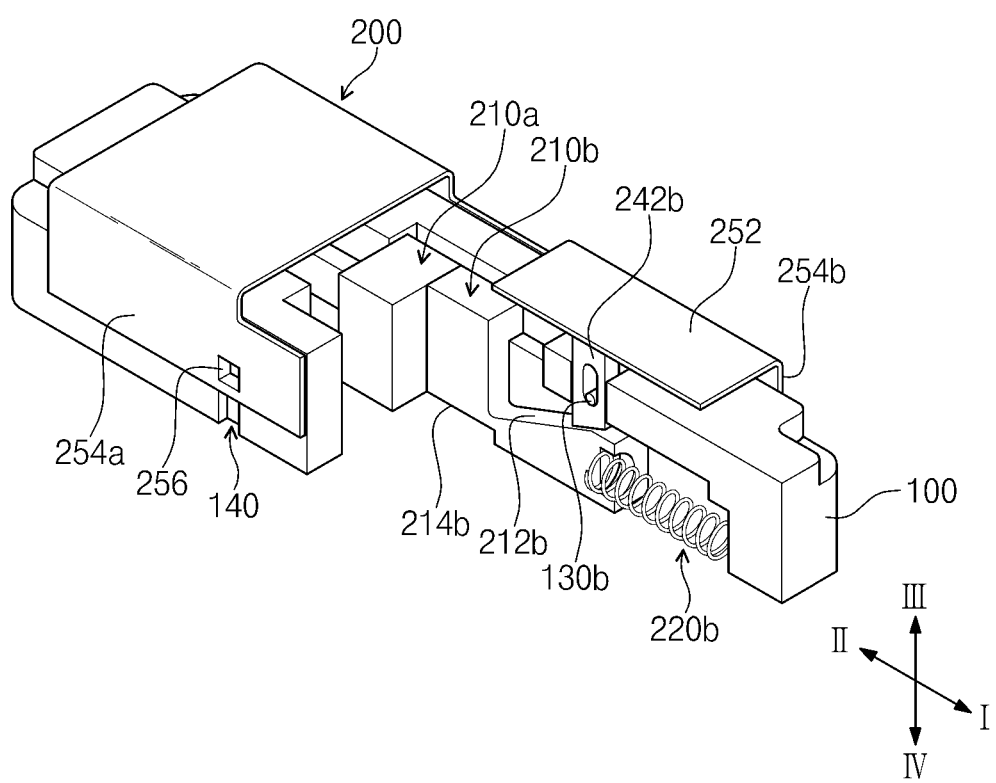
FIG. 2 is a perspective view illustrating an insert of FIG. 1.
Figure 3:
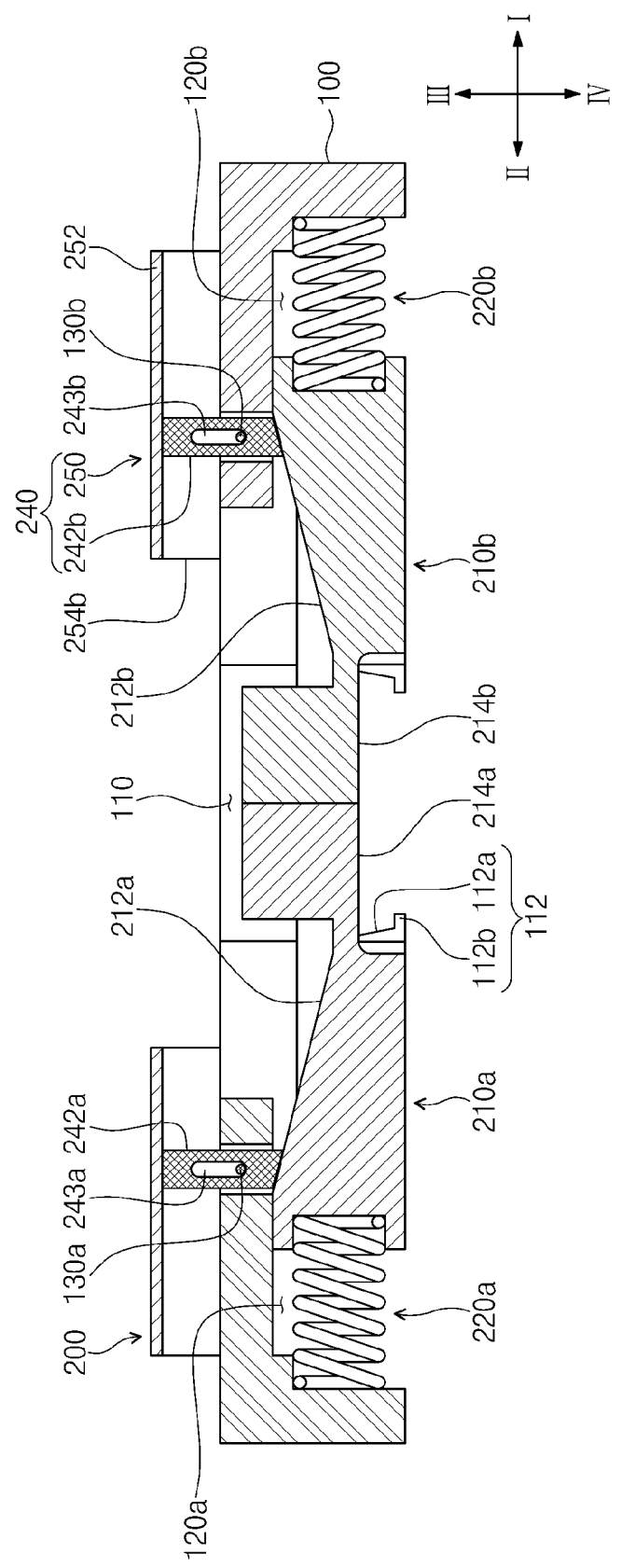
FIG. 3 is a cross-sectional view illustrating an insert of the type shown in FIG. 2.
Figure 4:
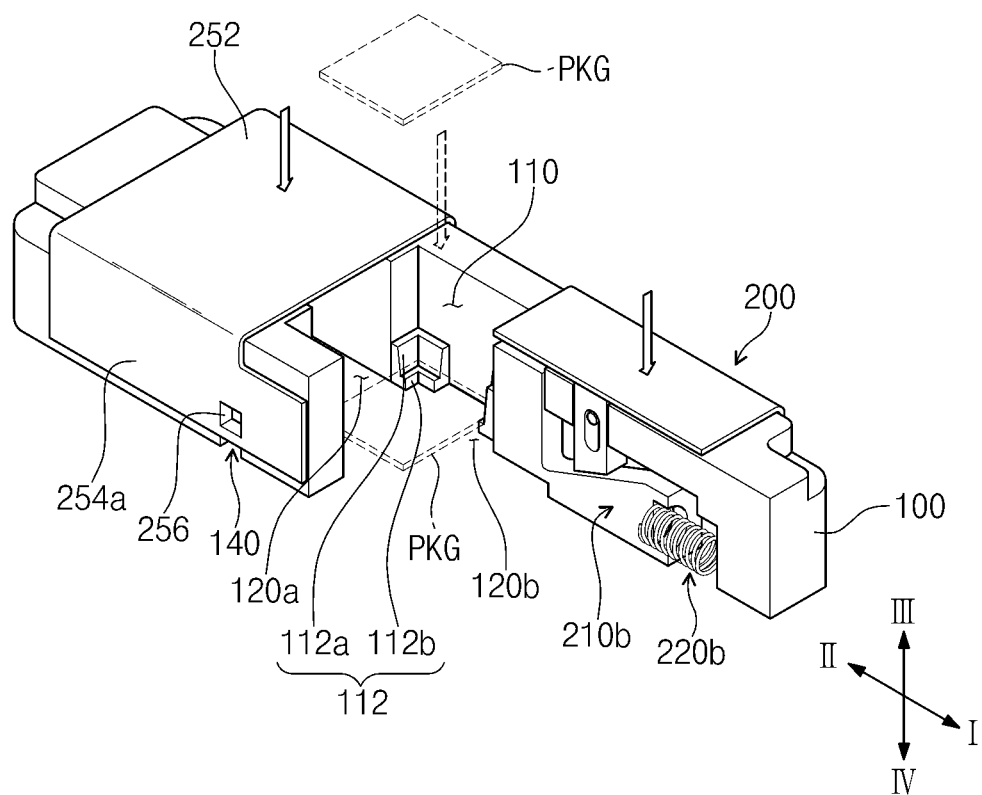
FIG. 4 is a perspective view illustrating an insert of the type shown in FIG. 2 in an open state.

FIG. 2 is a perspective view illustrating an insert 13 of FIG. 1. FIG. 3 is a cross-sectional view illustrating an insert 13 of the type shown in FIG. 2. FIG. 4 is a perspective view illustrating an insert 13 of the type shown in FIG. 2 in an open state;

Referring to FIGS. 2 to 4, each of the inserts 13 includes a body 100 and a sliding tool 200. The sliding tool 200 may be constructed and arranged to open and close a pocket region 110 of the body 100. In a condition in which the pocket 110 is an open state, the semiconductor package PKG can be positioned and received in the pocket 110. In a condition in which the pocket 110 is in a closed state, the sliding tool 200 secures the semiconductor package PKG in the pocket 110, preventing it from being released from the pocket 110.

In some embodiments, the body 110 may have a substantially rectangular parallelepiped shape. Hereinafter, a first direction I is one direction of longitudinal directions of the body 100, and a second direction II is the other direction of the longitudinal directions of the body 100. A third direction III is a vertical direction from a intermediate portion of the body 100 toward a top surface of the body 100, and a fourth direction IV is a vertical direction from the intermediate portion of the body 100 toward a bottom surface of the body 100.

In some embodiments, the pocket 110 receiving and securing the semiconductor package PKG may be positioned at a center region of the body 100. The pocket 110 may have a cross section of a quadrangle shape. The pocket 110 may penetrate the body 100 in the third and fourth directions III and IV.

Supporting members 112 may be positioned at bottom portions of corners of the pocket 110, respectively. In some embodiments, each of the supporting members 112 may include a supporting plate 112a and a protruding plate 112b. The supporting plate 112a may have an L-shape corresponding to a shape of the corner of the pocket 110, and the protruding plate 112b may protrude from a bottom portion of the supporting plate 112a toward the inner portion of the pocket 110. A thickness of the supporting plate 112a may become progressively increased from a top end toward a bottom end of the supporting plate 112a. In this manner, an inner surface of the supporting plate 112a may be inclined.

With the pocket 110 as the center, a first groove 120a may be provided in the body 100 in the second direction II relative to the pocket and a second groove 120b may be positioned in the body 100 in the first direction I relative to the pocket. The first and second grooves 120a and 120b may communicate with the pocket 110. A first slider 210a is received in the first groove 120a and a second slider 210b is received in the second groove 120b. Details on the construction and operation of the first and second sliders 210a and 210b will be described below.

The sliding tool 200 opens and closes the pocket 110 in a sliding fashion. In some embodiments, the sliding tool 200 may include first and second slider 210a and 210b, first and second elastic bodies 220a and 220b, and a pressure member 240.

In some embodiments, the first slider 210a and the second slider 210b are disposed in the body 100. The first slider 210a and the second slider 210b may be positioned to face each other on opposite sides of the pocket 110. In this manner, the first slider 210a is received in the first groove 120a of the body 100 and the second slider 210a is received in the second groove 120b of the body 100. The first elastic body 220a is disposed between the first slider 210a and an inner wall of the first groove 120a and is constructed and arranged to push, or bias, the position of the first slider 210a in the first direction I. The second elastic body 220b is disposed between the second slider 210b and an inner wall of the second groove 120b and is constructed and arranged to push, or bias, the position of the second slider 210b in the second direction II. In some embodiments, the first and second elastic bodies 220a and 220b may comprise compression coil springs, or other suitable biasing mechanisms. Inner ends of the first and second sliders 210a and 210b may be made to be in contact with each other by the first and second elastic bodies 220a and 220b, thereby closing the pocket 110.

A first sloped surface 212a may be present at a top surface of the first slider 210a. The first sloped surface 212a may be inclined in a downward direction with respect to the first direction I. A first step-difference part 214a is formed at a bottom surface of the first slider 210a. The first step-difference part 214a may cover a first sidewall facing in the second direction II of sidewalls of the semiconductor package PKG received in the pocket 110 and approximately one half of a top surface of the semiconductor package PKG.

A second sloped surface 212b may be present at a top surface of the second slider 210b. The second sloped surface 212b may be inclined in a downward direction with respect to the second direction II. A second step-difference part 214b is formed at a bottom surface of the second slider 210b. The second step-difference part 214b may cover a second sidewall facing in the first direction I of sidewalls of the semiconductor package PKG received in the pocket 110 and approximately the other half of the top surface of the semiconductor package PKG.

The pressure member 240 may push the first slider 210a in the second direction II and push the second slider 210b in the first direction I, thereby opening the pocket 110. The pressure member 240 includes first and second pressure loads 242a and 242b, and a pressing plate 250.

Figure 5:
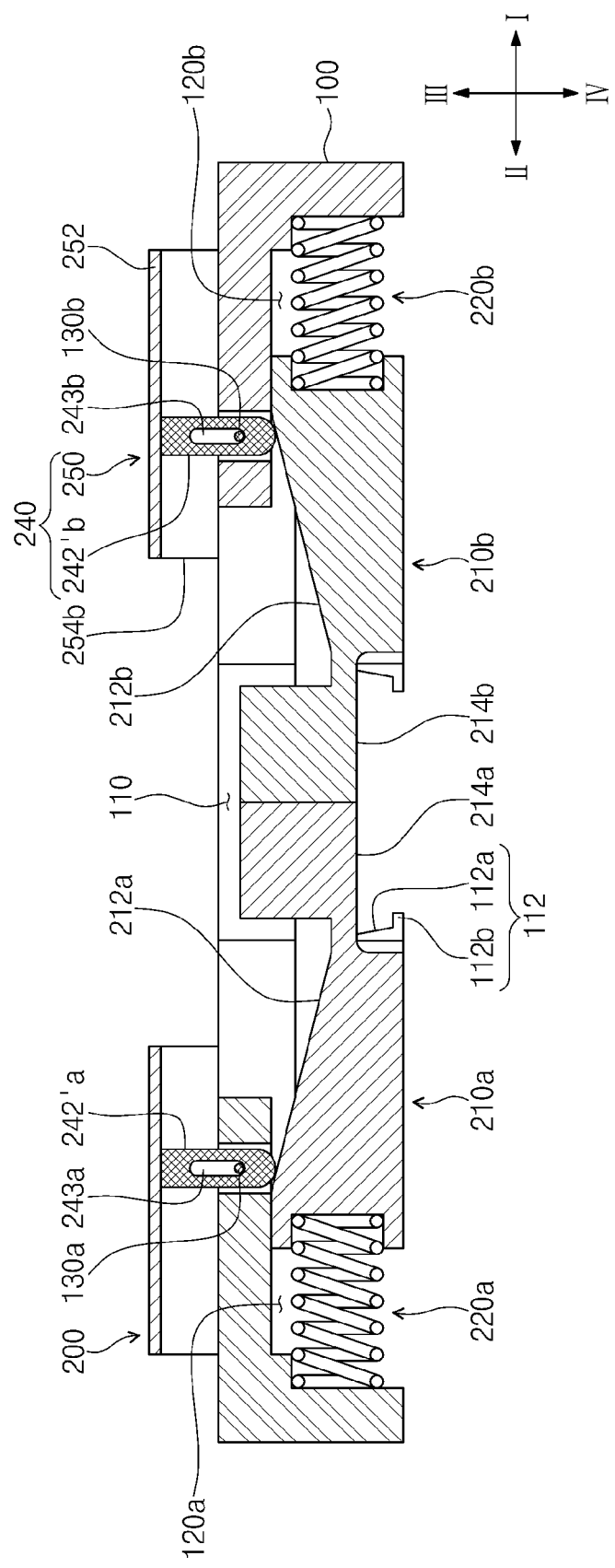
FIG. 5 is a cross-sectional view illustrating an insert according to another embodiment of inventive concepts.

The first pressure load 242a may be combined with the body 100. The first pressure load 242a is capable of moving in vertical directions, that is, in the third direction III and the fourth direction IV. In some embodiments, the bottom surface of the first pressure load 242a may be inclined so as to have the same gradient as the first slope surface 212a of the first slider 210a. Alternatively, in other embodiments, as illustrated in FIG. 5, a bottom surface of a first pressure load 242'a may be a curved surface, for example, in an arcuate shape. A first stopper hole 243a may be present in the first pressure load 242a. The first stopper hole 243a may extend in the longitudinal direction of the first pressure load 242a so that when coupled to the body, it extends in the vertical directions. A first stopper load 130a may be provided in the body 100. The first stopper load 130a may be inserted in the first stopper hole 243a. The first stopper load 130a may restrict up-and-down movement of the first pressure load 242a to be limited by the first stopper hole 243a.

The second pressure load 242b may be combined with the body 100. The second pressure load 242b is capable of moving in vertical directions, that is, in the third direction III and the fourth direction IV. In some embodiments, the bottom surface of the second pressure load 242b may be inclined so as to have the same gradient as the second slope surface 212b of the second slider 210b. Alternatively, in other embodiments, as illustrated in FIG. 5, a bottom surface of a second pressure load 242'b may be a curved surface, for example, in an arcuate shape. A second stopper hole 243b may be present in the second pressure load 242b. The second stopper hole 243b may extend in the longitudinal direction of the second pressure load 242b so that when coupled to the body, it extends in the vertical directions. A second stopper load 130b may be provided in the body 100. The second stopper load 130b may be inserted in the second stopper hole 243b. The second stopper load 130a may restrict up-and-down movement of the second pressure load 242b to be limited by the first stopper hole 243a.

In some embodiments, the pressing plate 250 includes a top plate 252, side plates 254a and 254b, and guide protrusions 256. The top plate 252 can be parallel to the top surface of the body 100 and extends in the first direction I and the second direction II. An opening corresponding to the pocket 110 is formed at the center portion of the body 100. The top plate 252 is coupled to a top end of the first pressure load 242a and a top end of the second pressure load 242b. The side plates 254a and 254b extend in a vertical direction downward from edges of long sides of the top plate 252. The guide protrusions 256 extend from inner surfaces of the side plates 254a and 254b toward the body 100. Guide grooves 140 are formed sidewalls of the body 100. The guide grooves 140 may extend in the third direction III and the fourth direction IV. The guide grooves 140 may guide up-and-down movement of the guide protrusions 256.

FIG. 6 is a cross-sectional view illustrating a method of receiving a semiconductor package into an insert of the type illustrated in FIG. 3. Referring to FIGS. 1 and 6, the transfer member 16 transfers the semiconductor package PKG from the first tray 12 into the insert 13 of the second tray 14. The transfer member 16 includes a picker 16-1 constructed and arranged for picking up the semiconductor package PKG, and pressing pins 16-2 combined with the picker 16-1. The pressing pins 16-2 extend from a bottom surface of the picker 16-1 in a perpendicular direction (i.e. the fourth direction IV).

The picker 16-1 picks up the semiconductor package PKG, for example using a vacuum, and moves onto the insert 13 of the second tray 13. The pressing pins 16-2 apply pressure to the top plate 252 of the pressing plate 250 of the insert 13 in the fourth direction IV in a manner that corresponds with a descent of the picker 16-1.

As the picker 16-1 descends, pressure is applied to the pressing plate 250 by the pressing pins 16-2, as shown by the uppermost arrows of FIG. 6. This, in turn, causes the first pressure load 242a to apply a pressure in a downward direction on the first slope surface 212a of the first slider 210a, and causes the second pressure load 242b to apply a pressure in a downward direction on the second slope surface 212b of the second slider 210b as shown by the intermediate arrows of FIG. 6.

As a result of the applied vertical pressure, the first slider 210a moves in the second direction II and the second slider 210b moves in the first direction I by a wedge action caused by the first and second pressure loads 242a and 242b and the first and second slope surfaces 212a and 212b, as shown by the lowermost arrows of FIG. 6. The pocket 110 is thereby opened by the outward movement of the first and second sliders 210a and 210b. When the pocket is opened, the vacuum is released, and the picker 16-1 releases or blows the semiconductor package PKG, so that the semiconductor package PKG is received in the opened pocket 110. At this time, the semiconductor package PKG descends along the inclined supporting plate 112a to safely reach position on the protruding plate 112b.

Subsequently, when the picker 16-1 ascends, the first elastic body 220a pushes the first slider 210a in the first direction I and the second elastic body 220b pushes the second slider 210b in the second direction II, so that the pocket 110 may be closed by the first and second sliders 210a and 210b. At this time, the first step-difference part 214a of the first slider 210a and the second step-difference part 214b of the second slider 210b cover the sidewalls and the top surface of the semiconductor package PKG. The first and second pressure loads 242a and 242b and the pressing plate 250 may ascend to return to an initial position by the movement of the first and second sliders 210a and 210b.

Figure 7A:
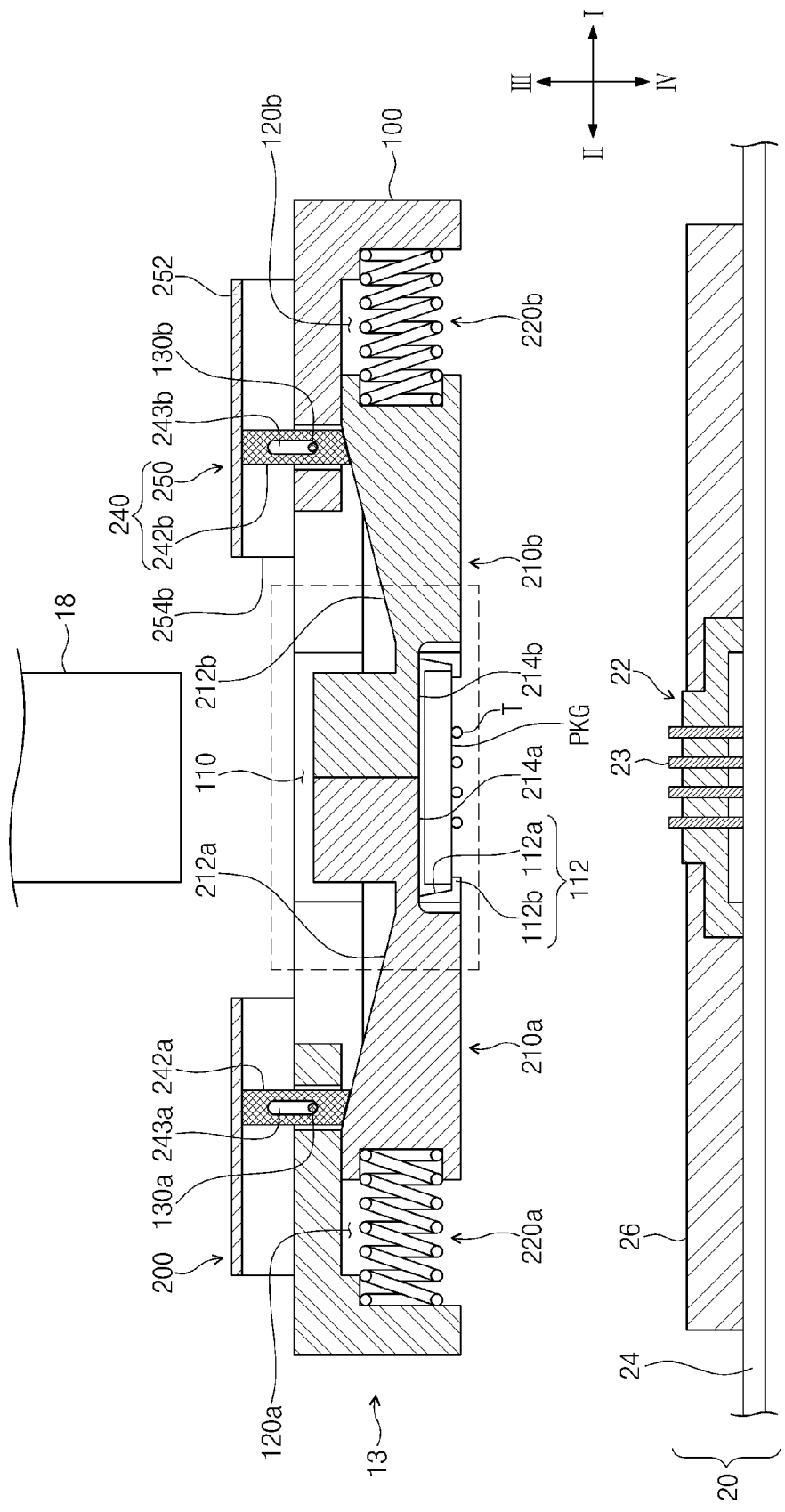
FIGS. 7A and 7B are cross-sectional views illustrating a method of contacting an insert of the type illustrated in FIG. 3 to a socket part.
Figure 7B:
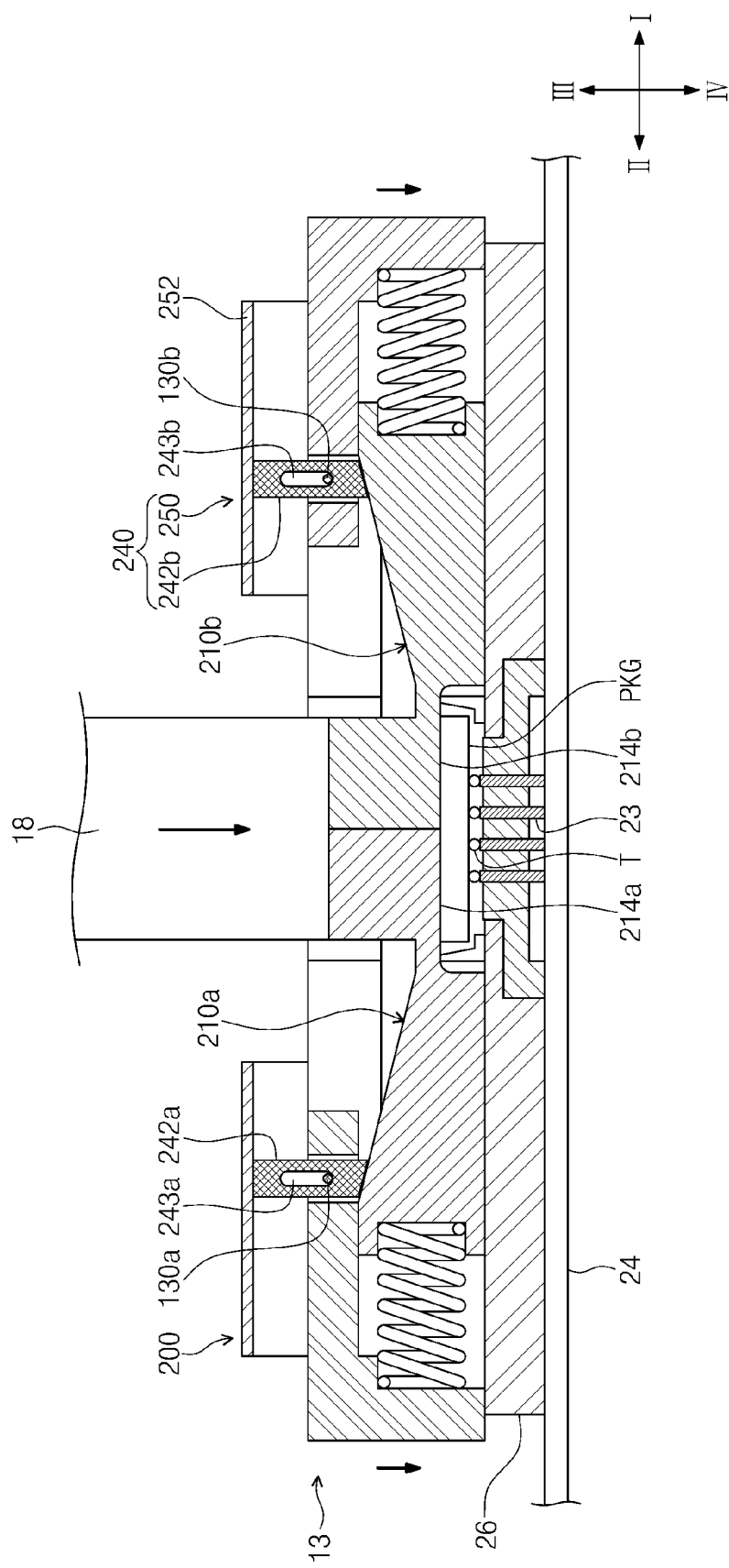

FIGS. 7A and 7B are cross-sectional views illustrating a method of contacting an insert of the type illustrated in FIG. 3 to a socket part. Referring to FIGS. 1, 7A, and 7B, the socket part 20 includes the socket 22, a test circuit substrate 24, and a socket guide 26. The socket 22 has a plurality of socket pins 23. For example, the socket pins 23 may be pogo pins. The socket 22 is set on the test circuit substrate 24, and the socket pins 23 are electrically connected to circuit interconnections on the test circuit substrate 24. The socket guide 26 is set on the test circuit substrate 22 and surrounds the socket 22.

The semiconductor package PKG received in the insert 13 is transferred into position over the socket part 20. An external impact or jarring force may inadvertently be applied to the insert 13 during the transfer of the insert 13. However, since the semiconductor package PKG is received in the closed pocket 110 by the first and second sliders 210a and 210b, it is possible to prevent the semiconductor package PKG from being separated from the pocket 110. Additionally, since the semiconductor package PKG is prevented from being separated from the pocket 110, it is possible to prevent the socket 24 of the socket part 20 from being broken or inadvertently contacted as a result of the separation of the semiconductor package PKG.

The position of the insert 13 may be finely adjusted to align external terminals T of the semiconductor package PKG with the socket pins 23 of the socket part 20. The pusher 18 is located over the insert 13 as illustrated in FIG. 7A.

Subsequently, the insert 13 is set on the socket guide 26, and the external terminals T of the semiconductor package PKG are made to be in contact with the socket pins 23. The semiconductor package PKG is pushed in an ascending, or vertical, direction III as a result of the contact of the external terminals T and the socket pins 23, and the top surface of the semiconductor package PKG is made to be in contact with the step-difference parts 214a and 214b of the first and second sliders 210a and 210b, as shown in FIG. 7B. In this state, the pusher 18 descends to pressure the first and second sliders 210a and 210b. The test signal is transmitted from the socket pins 23 to the external terminals T of the semiconductor package PKG, and the resulting reply signal is transmitted from the external terminals T of the semiconductor package PKG to the socket pins 23.

Figure 8:
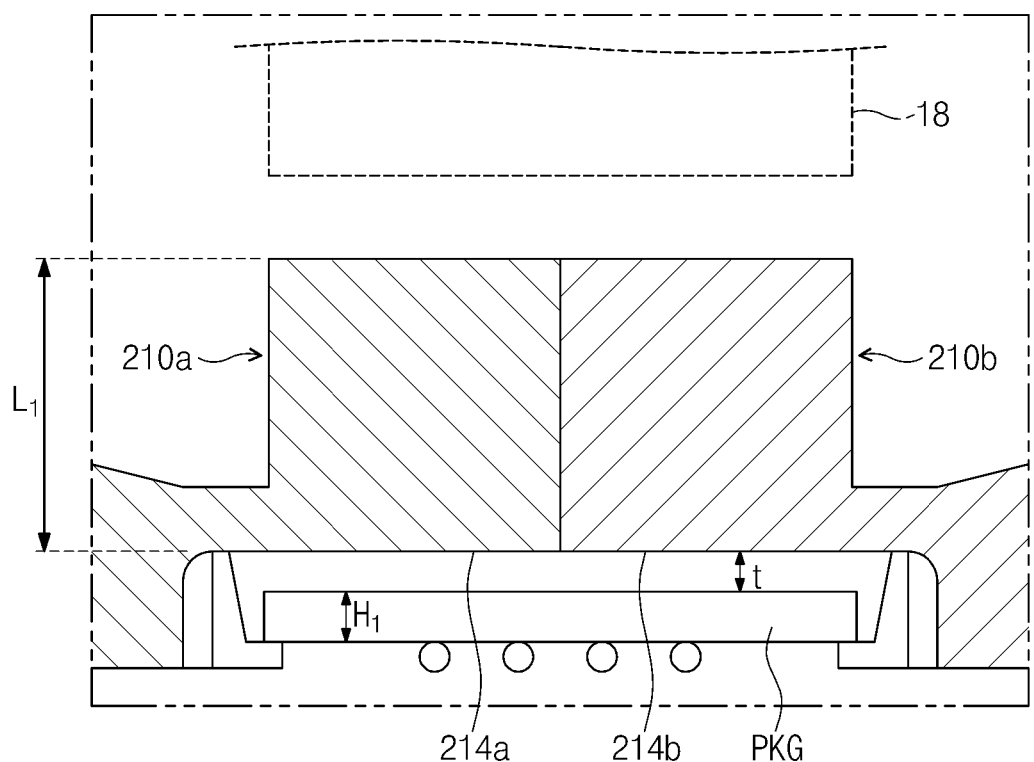
FIGS. 8 to 10 are cross-sectional views illustrating a corresponding height change in the step-difference parts of sliders in accordance with a change in thickness of a semiconductor package according to embodiments of the inventive concepts.
Figure 9:
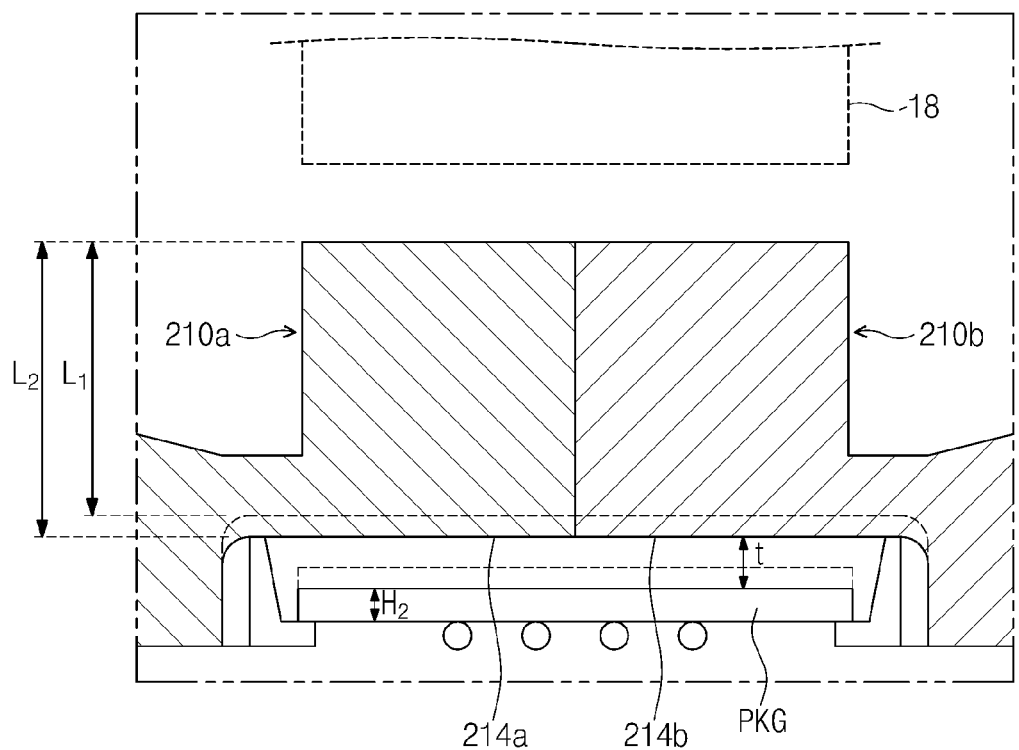
Figure 10:
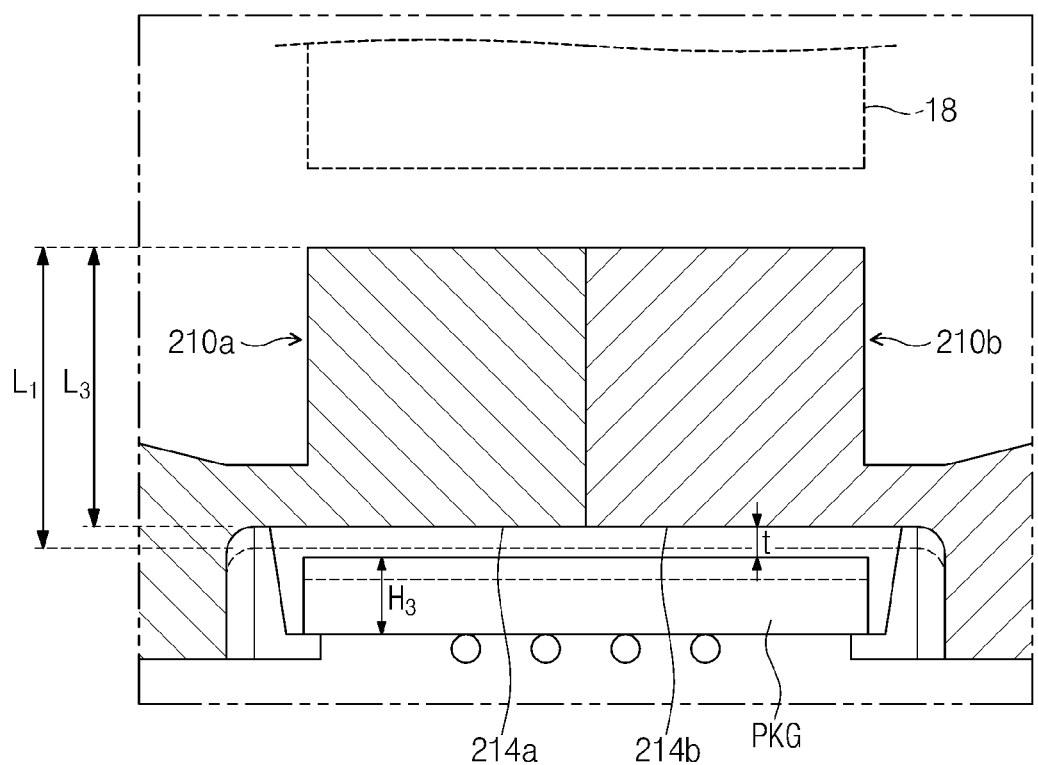

FIGS. 8 to 10 are cross-sectional views illustrating a corresponding height change in the step-difference parts of sliders in accordance with a change in thickness of a semiconductor package according to embodiments of the inventive concepts. Referring to FIGS. 8 to 10, the shape of the insert may be varied in accordance with the shape of the semiconductor package in order to maintain a predetermined space t between the top surface of the semiconductor package PKG and horizontal surfaces of the first and second step-difference parts 214a and 214b. In other words, inserts having shapes that are different from each other may be used to respectively correspond to semiconductor packages having different heights from each other. In particular, the vertical clearance of the pocket region may be varied to accommodate packages of different thicknesses.

For example, when a semiconductor package PKG having a height $H_1$ is received in an insert, the insert may have a distance $L_1$ between the top surfaces of the sliders 210a and 210b and horizontal surfaces of the step-difference parts 214a and 214b for maintaining the space t between the top surface of the semiconductor package PKG and horizontal surfaces of the step-difference parts 214a and 214b, as illustrated in FIG. 8.

When a semiconductor package PKG having a height $H_2$ that is relatively smaller than the height $H_1$ is received in an insert, another insert having a distance $L_2$ greater than the distance $L_1$ may be provided for maintaining the space t, as illustrated in FIG. 9. Alternatively, when a semiconductor package PKG having a height $H_3$ greater than the height $H_1$ is received in an insert, another insert having a distance $L_3$ smaller than the distance $L_1$ may be provided for maintaining the space t, as illustrated in FIG. 10. The distances $L_2$ and $L_3$ correspond to distances between the top surfaces of the sliders 210a and 210b and changed horizontal surfaces of the step-difference parts 214a and 214b.

As described above, since the inserts having the different distances between the top surfaces of the sliders 210a and 210b and the horizontal surfaces of the step-difference parts 214a and 214b are used corresponding to the height change of the semiconductor package, the same, common, pusher 18 may be used for semiconductor packages of various heights. This is because a working distance of the pusher 18 is maintained identically when the constant space t between the top surfaces of the semiconductor package PKG and the horizontal surfaces of the step-difference parts 214a and 214b is maintained.

Since the pusher 18 is used in common, it is possible to reduce manufacture cost and replacement time of the pusher 18. Additionally, it is possible to prevent a contact fail or breakage of the semiconductor package PKG and the socket 22 caused by a replacement error of the pusher 18.

Figure 11:
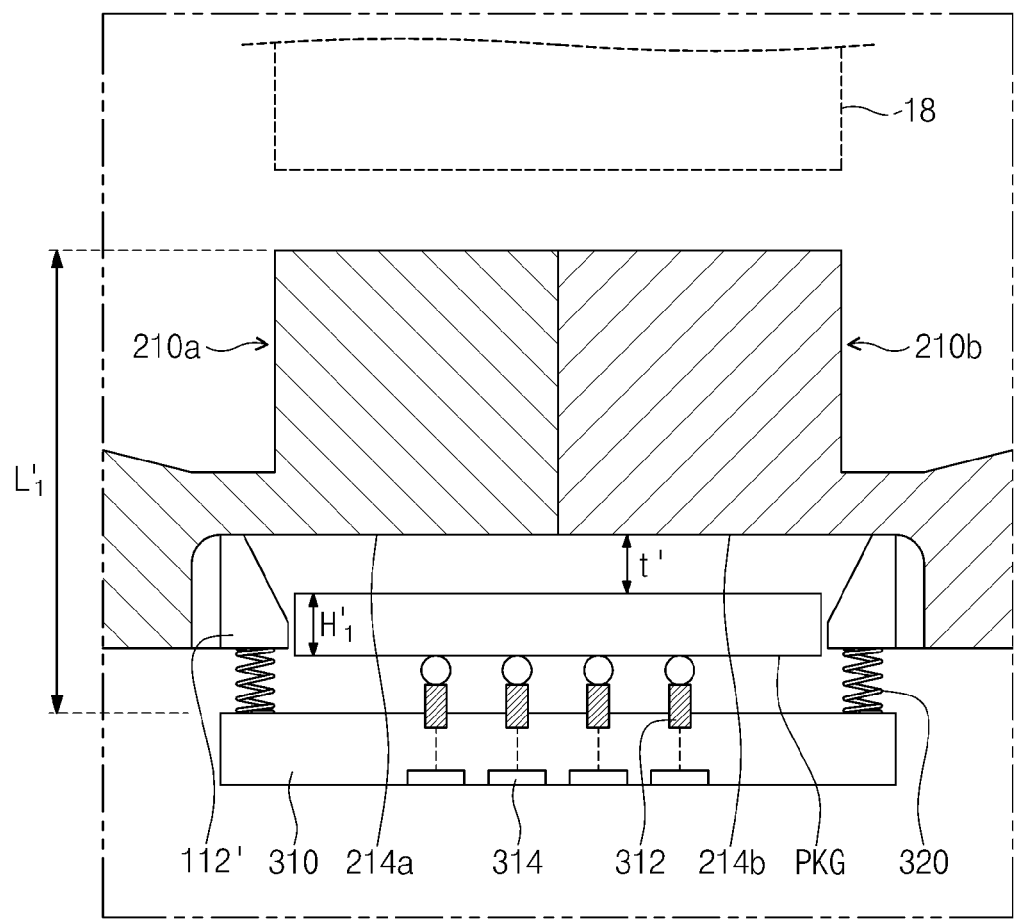
FIG. 11 is a cross-sectional view illustrating a concave portion of an insert according to embodiments of the inventive concepts.

FIG. 11 is a cross-sectional view illustrating a concave portion of an insert according to embodiments of the inventive concepts. Referring to FIG. 11, guide members 112' guiding the semiconductor package PKG may be provided at bottom portions of the corners of the pocket (not shown). Each of the guide members 112' may have an 'L'-shape corresponding to a shape of the corner of the pocket. A thickness of the guide member 112' may become progressively increased from a top end toward a bottom end of the guide member 112'. Thus, inner surfaces of the guide members 112' may be inclined.

A printed circuit substrate 310 may be provided under the guide members 112'. First connection terminals 312 may be provided on a top surface of the printed circuit board 310, and second connection terminals 314 may be provided on a bottom surface of the printed circuit board 310. The second connection terminals 314 are electrically connected to the first connection terminals 312. The printed circuit board 310 may be connected to the bottom ends of the guide members 112' by elastic bodies 320. In some embodiments, the elastic bodies 320 may comprise coil springs.

The semiconductor package PKG provided in the insert descends along the inclined surfaces of the guide members 112' to safely reach a position of rest on the printed circuit board 310. At this time, external terminals of the semiconductor package PKG are in contact with the first connection terminals 312.

An insert may be changed in accordance with the a shape, for example, the thickness, of the semiconductor package to be testes, in order to maintain a predetermined space t' between the top surface of the semiconductor package PKG and horizontal surfaces of the step-difference parts 214a and 214b. In other words, inserts having shapes different from each other may be used to respectively correspond to semiconductor packages having different heights from each other.

For example, when a semiconductor package PKG having a height $H'_1$ is received in an insert, the insert may have a distance $L'_1$ between the top surfaces of the sliders 210a and 210b and the top surface of the printed circuit board 310 for maintaining the space t' as illustrated in FIG. 11.

Figure 12:
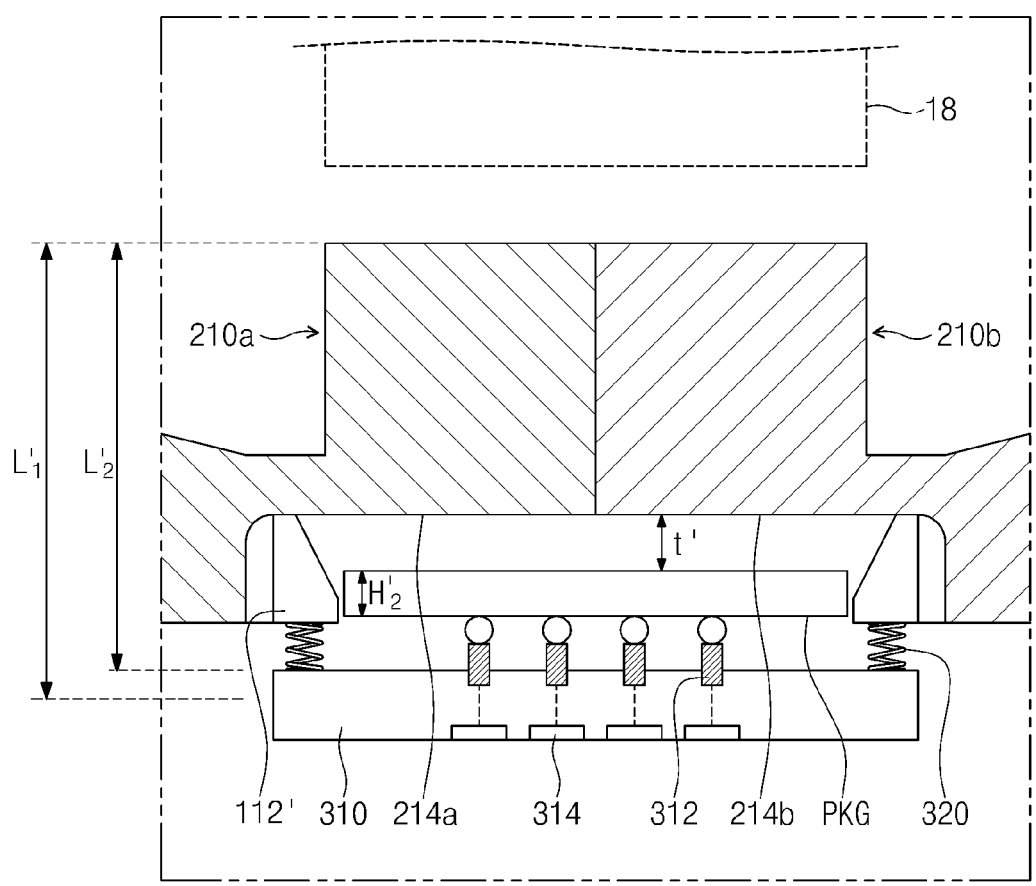
FIGS. 12 and 13 are cross-sectional views illustrating a position change of a printed circuit board in accordance with a change in thickness of a semiconductor package according to embodiments of the inventive concepts.
Figure 13:
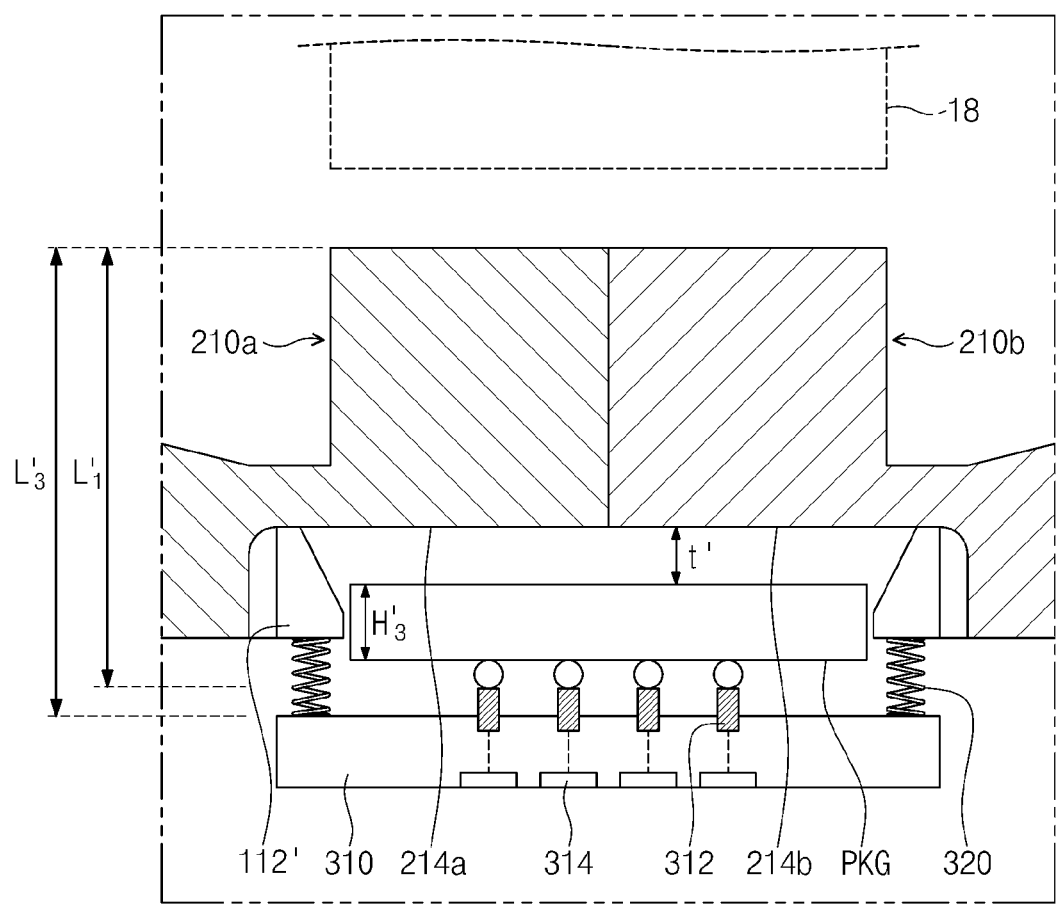

When a semiconductor package PKG having a height $H'_2$ that is smaller than the height $H'_1$ is received in an insert, another insert having a distance $L'_2$ smaller than the distance $L'_1$ may be provided for maintaining the space t' as illustrated in FIG. 12. Alternatively, when a semiconductor package PKG having a height $H'_3$ greater than the height $H'_1$ is received in an insert, another insert having a distance $L'_3$ greater than the distance $L'_1$ may be provided for maintaining the space t' as illustrated in FIG. 13. In this example embodiment, the distances $L'_2$ and $L'_3$ correspond to distances between the top surfaces of the sliders 210a and 210b and the top surface of the printed circuit board 310 of which a position is changed.

As described above, since the inserts having the different distances between the top surfaces of the sliders 210a and 210b and the top surface of the printed circuit board 310 are used corresponding to the height change of the semiconductor package, the pusher 18 may be used in common for semiconductor packages of various heights or thicknesses. This is because a working distance of the pusher 18 is maintained identically when the constant space t' between the top surfaces of the semiconductor package PKG and the horizontal surfaces of the step-difference parts 214a and 214b is maintained.

Figure 14A:
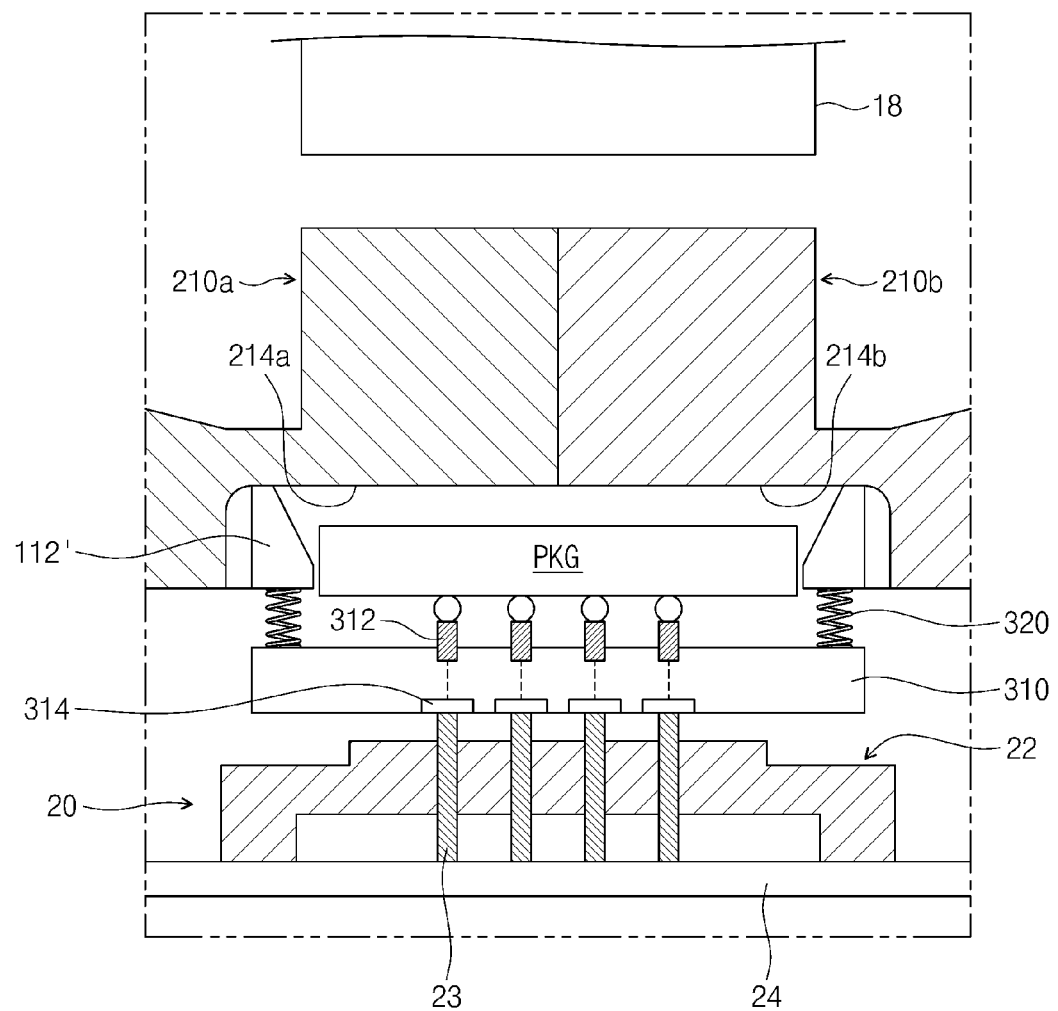
FIGS. 14A and 14B are cross-sectional views illustrating a method of contacting an insert of FIG. 11 to a socket part, according to embodiments of the inventive concepts.
Figure 14B:
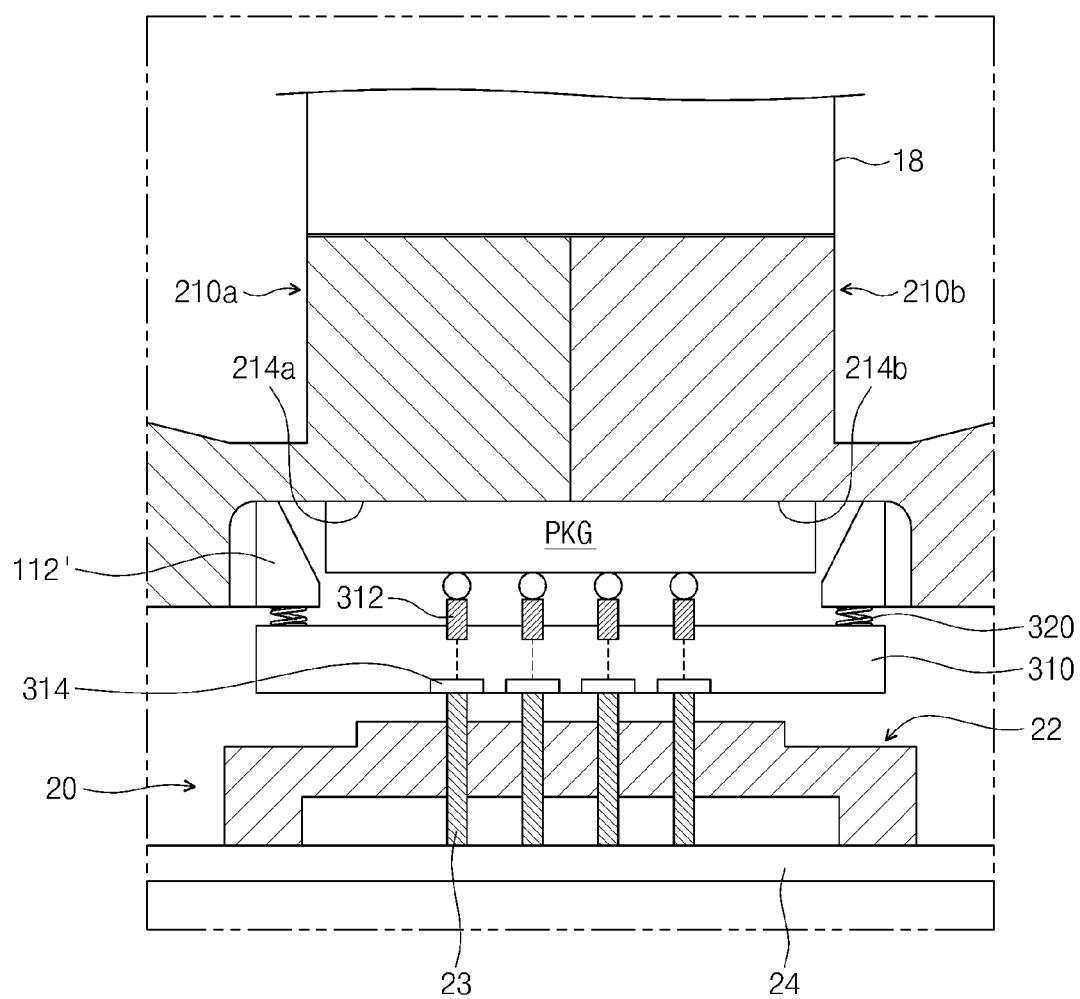

FIGS. 14A and 14B are cross-sectional views illustrating a method of contacting an insert of FIG. 11 to a socket part, according to embodiments of the inventive concepts. Referring to FIGS. 14A and 14B, the insert receiving the semiconductor package PKG is moved into position over the socket part 20. The position of the insert may be finely adjusted to align the second connection terminals 314 of the printed circuit board 310 with the socket pins 23. The pusher 18 is located over the insert.

Subsequently, the second connection terminals 314 are in contact with the socket pins 23 as a result of a descent of the insert. The printed circuit board 310 and the semiconductor package PKG are pushed to ascend by the contact of the second connection terminals 314 and the socket pins 23, as illustrated in FIG. 14A.

The pusher 18 pressures the first and second slider 210a and 210b. By the pressure of the pusher 18, the first and second slider 210a and 210b descend and the top surface of the semiconductor package PKG is made to be in contact with the horizontal surfaces of the first and second step-difference parts 214a and 214b. At this time, the top surface of the semiconductor package PKG may be biased against the horizontal surfaces of the first and second step-difference parts 214a and 214b by elastic members within the socket pins 23 and the elastic bodies 320 between the printed circuit board 310 and the guide members 112'. Additionally, a certain part of an external force applied to the socket pins 23 may be offset by buffering of the elastic bodies 320.

According to the inventive concept, it may be possible to prevent the semiconductor package from being inadvertently separated from the insert.

According to the inventive concept, it may be possible to prevent the socket from being damaged by the inadvertent separation or repositioning of the semiconductor package.

According to the inventive concept, the same, common pusher may be used for testing semiconductor packages of different thicknesses.

According to the inventive concept, since the same, common, pusher can be used it is possible to reduce manufacture cost and replacement time of the pusher, and it is possible to prevent a breakage of the semiconductor package that could otherwise be caused during a pusher replacement operation.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. An insert for a semiconductor package testing apparatus, comprising:
   a body having a pocket constructed and arranged to receive the semiconductor package; and
   a sliding tool slidingly positioned on the body, the sliding tool constructed and arranged to open and close the pocket as a result of a sliding motion of the sliding tool relative to the body,
   wherein the sliding tool comprises first and second sliders disposed at opposite portions of the pocket and coupled to each other to clamp the semiconductor package on the pocket.

2. The insert of claim 1, wherein the sliding tool comprises:
   a first biasing unit that is biased to urge the first slider in a first direction toward the second slider; and
   a second biasing unit that is biased to urge the second slider in a second direction toward the first slider.

3. The insert of claim 1, wherein the sliding tool further comprises:
   a pressure member constructed and arranged to push the first slider in the second direction and to push the second slider in the first direction as a result of an applied vertical pressure.

4. The insert of claim 3, wherein the first slider comprises a first sloped surface inclined in a downward direction with respect to the first direction at a top surface of the first slider, and the second slider comprises a second sloped surface inclined in a downward direction with respect to the second direction at a top surface of the second slider; and
wherein the pressure member comprises:
a first pressure load in communication with the body, the first pressure load constructed and arranged to move in a vertical direction relative to a horizontal direction of extension of the body, the first pressure load communicating with the first sloped surface of the first slider; and
a second pressure load in communication with the body, the second pressure load constructed and arranged move in the vertical direction, and the second pressure load communicating with the second sloped surface of the second slider.

5. The insert of claim 4, further comprising stopper holes in the first and second pressure loads that mate with limiters on the body to restrict travel in the vertical direction of the first and second pressure loads relative to the body.

6. The insert of claim 4, wherein a bottom surface of the first pressure load is inclined with the same gradient as the first sloped surface, and wherein a bottom surface of the second pressure load is inclined with the same gradient as the second sloped surface.

7. The insert of claim 4, wherein the bottom surfaces of the first and second pressure loads have curved lower surfaces.

8. The insert of claim 4, wherein the pressure member further comprises a pressing plate coupled to top ends of the first and second pressure loads;
wherein the pressing plate comprises:
a top plate extending in the first and second horizontal directions, wherein the top ends of the first and second pressure loads are coupled to the top plate, wherein the top plate further comprises an opening corresponding to the pocket;
side plates extending in the downward direction from sides of the top plate; and
guide protrusions extending from inner surfaces of the side plates,
wherein the body includes guide grooves constructed and arranged to communicate with the guide protrusions.

9. The insert of claim 2, wherein the first and second elastic bodies comprise springs.

10. The insert of claim 2, wherein a first step-difference part comprises a first bottom surface of the first slider, and wherein the first step-difference part covers a first sidewall facing in the second direction of sidewalls of the semiconductor package and a portion of a top surface of the semiconductor package;
wherein a second step-difference part comprises a second bottom surface of the second slider, and wherein the second step-difference part covers a second sidewall facing in the first direction of sidewalls of the semiconductor package and another portion of the top surface of the semiconductor package; and
wherein horizontal surfaces of the first and second step-difference parts are spaced apart from the top surface of the semiconductor package by a predetermined distance.

11. The insert of claim 1, further comprising:
a printed circuit board positioned under the pocket and supporting the semiconductor package; and
an elastic body connecting the printed circuit board to a bottom of the pocket,
wherein first connection terminals are provided on a top surface of the printed circuit board and are constructed and arranged to be in contact with external terminals of the semiconductor package; and
wherein second connection terminals are provided on a bottom surface of the printed circuit board and are electrically connected to the first connection terminals.

12. A testing apparatus comprising:
an insert constructed and arranged to receive a semiconductor package;
a socket that applies a test signal to the semiconductor package; and
a pusher that applies a contact pressure to the insert to bring the semiconductor package into contact with the socket,
wherein the insert comprises:
a body having a pocket constructed and arranged to receive the semiconductor package; and
a sliding tool slidingly positioned on the body, the sliding tool constructed and arranged to open and close the pocket as a result of a sliding motion of the sliding tool relative to the body,
wherein the sliding tool comprises first and second sliders disposed at opposite portions of the pocket and coupled to each other to clamp the semiconductor package on the pocket.

13. The testing apparatus of claim 12, wherein the sliding tool comprises:
first and second sliders at opposite portions of the pocket;
a first biasing unit that is biased to urge the first slider in a first direction toward the second slider; and
a second biasing unit that is biased to urge the second slider in a second direction toward the first slider;
wherein the pusher applies the contact pressure to pressure the first and second sliders to bring the semiconductor package into contact with the socket in a state in which the pocket is closed.

14. The testing apparatus of claim 13, wherein the first slider comprises a first sloped surface inclined in a downward direction with respect to the first direction at a top surface of the first slider, and the second slider comprises a second sloped surface inclined in a downward direction with respect to the second direction at a top surface of the second slider, and
wherein the sliding tool comprises:
a first pressure load in communication with the body, the first pressure load constructed and arranged to move in a vertical direction relative to a horizontal direction of extension of the body, the first pressure load communicating with the first sloped surface of the first slider;
a second pressure load in communication with the body, the second pressure load constructed and arranged move in the vertical direction, and the second pressure load communicating with the second sloped surface of the second slider; and
a pressing plate coupled to top ends of the first and second pressure loads, wherein the top plate further comprises an opening corresponding to a region above the pocket.

15. The testing apparatus of claim 14, further comprising:
a transfer member constructed and arranged to transfer the semiconductor package received in a tray to the insert,
wherein the transfer member comprises:
a picker that picks up the semiconductor package; and
a pressing pin combined with the picker,
wherein the pressing pin pressures the pressing plate, thereby opening the pocket; and wherein the picker introduces the semiconductor package into the pocket through the opening.

16. An insert for a semiconductor testing apparatus comprising:
- a body having a pocket constructed and arranged to receive a semiconductor package to be tested, the semiconductor package having a height and having a lower surface and an upper surface;
- a sliding tool slidingly attached to the body for opening and closing the pocket and constructed and arranged to support the semiconductor package at the lower surface of the semiconductor package; the pocket, when in a closed position, having a ceiling and the ceiling having a first clearance distance above the upper surface of the semiconductor package when supported in the sliding tool, the first clearance distance being determined based on the height of the semiconductor package to be tested,
- wherein the sliding tool comprises first and second sliders disposed at opposite portions of the pocket and coupled to each other to clamp the semiconductor package on the pocket.

17. The insert of claim 16 further comprising a force transfer portion of the sliding tool above the ceiling, the force transfer portion having a thickness above the ceiling and wherein the thickness is determined based on the height of the semiconductor package to be tested.

18. The insert of claim 17 wherein the insert comprises multiple inserts, each of the multiple inserts corresponding to a different semiconductor package to be tested, and wherein the thickness of the force transfer portion above the ceiling of each of the multiple insert varies in accordance with the height of the corresponding semiconductor package to be tested.

19. The insert of claim 16 wherein the sliding tool is constructed and arranged to open and close the pocket as a result of a sliding motion of the sliding tool relative to the body.

20. The insert of claim 16, wherein the sliding tool comprises:
- first and second sliders at opposite portions of the pocket;
- a first biasing unit that is biased to urge the first slider in a first direction toward the second slider;
- a second biasing unit that is biased to urge the second slider in a second direction toward the first slider; and
- a pressure member constructed and arranged to push the first slider in the second direction and to push the second slider in the first direction as a result of an applied vertical pressure.

* * * * *